United States Patent
Shukla et al.

(10) Patent No.: US 8,516,853 B2
(45) Date of Patent: Aug. 27, 2013

(54) METHOD OF FASTENING LAMELLAE OF A LAMELLAR MATERIAL ON A SUITABLE SUBSTRATE

(75) Inventors: Abhay Shukla, L'Hay les Roses (FR); Javed Mazher, Paris (FR)

(73) Assignees: Universite Pierre et Marie Curie (Paris 6), Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/565,452

(22) Filed: Aug. 2, 2012
(Under 37 CFR 1.47)

(65) Prior Publication Data

US 2013/0000833 A1  Jan. 3, 2013

Related U.S. Application Data

(63) Continuation of application No. 12/682,509, filed as application No. PCT/FR2008/001385 on Oct. 3, 2008, now abandoned.

(30) Foreign Application Priority Data

Oct. 11, 2007 (FR) ...................... 07 07145

(51) Int. Cl.
*C03B 19/10* (2006.01)
*C03B 23/20* (2006.01)
*C03B 27/00* (2006.01)
*B29C 65/00* (2006.01)

(52) U.S. Cl.
USPC .................. 65/40; 65/17.1; 65/36; 156/272.2

(58) Field of Classification Search
USPC ............................. 65/17.1, 36, 40; 156/272.2
See application file for complete search history.

(56) References Cited

U.S. PATENT DOCUMENTS

| | | | |
|---|---|---|---|
| 4,746,538 A | 5/1988 | Mackowski | |
| 5,914,562 A * | 6/1999 | Khan et al. | 313/582 |
| 6,127,629 A | 10/2000 | Sooriakumar et al. | |
| 2003/0092243 A1 * | 5/2003 | Hirschfeld et al. | 438/455 |
| 2005/0082581 A1 | 4/2005 | Hofman et al. | |
| 2008/0210570 A1 | 9/2008 | Schuster et al. | |

FOREIGN PATENT DOCUMENTS

FR   2 592 874 A   7/1987
JP   09-086943 A   3/1997

OTHER PUBLICATIONS

Gerlach et al., "Low-Temperature Anodic Bonding of Silicon to Silicon Wafers by Means of Intermediate Glass Layers", Microsystem Technologies (no month, 1999), vol. 5, pp. 144-149.*
Albaugh et al., "Mechanisms of Anodic Bonding of Silicon to Pyrex Glass", IEEE, no month, 1988, pp. 1-2.
Gerlach et al., "Low-Temperature Anodic Bonding of Silicon Wafers by Means of Intermediate Glass Layers", Microsystem Technologies (no month, 1999), vol. 5, pp. 144-149.
UGQ Optics, "Corning Pyrex 7740 Borosilicate Chemical Composition", pp. 1-2.

* cited by examiner

*Primary Examiner* — Edna Wong
(74) *Attorney, Agent, or Firm* — Sughrue Mion, PLLC

(57) ABSTRACT

The invention provides a method of fastening lamellae of a lamellar material that is at least partially conductive onto an insulating substrate (2) containing oxides that are suitable for dissociating into mobile ions of given charge and stationary ions of opposite charge, the method comprising the steps of:
placing a sample (1) of the lamellar material against a surface of the substrate;
causing the oxides of the substrate to dissociate; and
subjecting the substrate and the sample to an electric field by means of an electrode in contact with the substrate and an electrode in contact with the sample.

8 Claims, 1 Drawing Sheet

METHOD OF FASTENING LAMELLAE OF A LAMELLAR MATERIAL ON A SUITABLE SUBSTRATE

This is a Continuation of application Ser. No. 12/682,509 filed Apr. 9, 2010, now abandoned, which is the National Stage application of PCT/FR2008/001385, filed on Oct. 3, 2008, claiming priority based on French Patent Application No. 07 07145, filed on Oct. 11, 2007, the contents of all of which are incorporated herein by reference in their entirety.

The invention relates to a method of fastening of lamellae of a lamellar material on a suitable substrate.

BACKGROUND OF THE INVENTION

Materials are known that are suitable for presenting a special crystal structure in which the atoms become preferentially arranged in atomically thin plane structures or "lamellae" within which the atoms are strongly bonded together, while weaker bonds act between the atoms of two adjacent lamellae. Such lamellae may present thicknesses of one or a few monatomic layers.

Various materials, e.g. semiconductor materials such as InSe or GaS, and metallic materials, possibly superconductors, such as graphite, $NbSe_2$, $TaS_2$, or $MgB_2$, are suitable for presenting a lamellar structure. With reference more particularly to graphene, methods are known for mechanically separating lamellae, which methods consist either in cleaving or scraping a piece of graphite, or in applying an adhesive tape to a piece of graphite and tearing it off. It is then necessary to use an optical microscope to search for any graphene lamellae that might have become detached from the piece of graphite. In order to handle or process these graphene lamellae, and in particular to order to prevent them rolling up, it is then appropriate to fasten the lamellae on a substrate, e.g. using resin, and that is found to be difficult. Those methods are poorly reproducible and are not suitable for mass production.

OBJECT OF THE INVENTION

An object of the invention is to provide a method of fastening lamellae on a suitable substrate, which method is particularly adapted to lamellar materials that are conductive or semiconductive.

BRIEF SUMMARY OF THE INVENTION

To achieve this object, there is provided a method of fastening lamellae of a lamellar material that is at least partially conductive onto an insulating substrate containing oxides that are suitable for dissociating into mobile ions of given charge and stationary ions of opposite charge, the method comprising the steps of:
  placing a sample of the lamellar material against a surface of the substrate;
  causing the oxides of the substrate to dissociate; and
  subjecting the substrate and the sample to an electric field by means of an electrode in contact with the substrate and an electrode in contact with the sample.

The dissociation of the oxides in the substrate makes the substrate conduct weakly, sufficiently to enable an electric current to be established between the electrodes when the electric field is applied. Under the effect of the electric field, the mobile ions migrate towards the electrode in contact with the substrate, leaving in place the stationary ions of opposite charge, thereby creating an electric charge at the interface between the substrate and the sample. After the electric field has been applied for a certain length of time, lamellae of the sample in contact with the substrate become strongly bonded to the substrate.

It then suffices to eliminate the major fraction of the sample so as to leave behind only a thin layer bonded to the substrate. This thin layer contains some lamellae that are in contact with the substrate and that are strongly bonded thereto, and other lamellae that cover the lamellae that are bonded to the substrate, at least in part, and that, being less strongly bonded to the substrate, are suitable for being eliminated, e.g. by being peeled off. This leaves behind on the surface of the substrate a thin layer having a thickness of a few atoms or even of only one atom.

This fastening is obtained in a few minutes without using an adhesive. It is very inexpensive and easily industrialized. This method is in competition with known fastening methods, e.g. adhesive bonding with a resin, and also with methods of depositing monocrystalline layers or methods of growing crystals on the surface of the substrate, such as evaporation methods, molecular beam methods, laser sputtering methods, . . . .

The size of the thin layer fastened in this way to the substrate depends to a large extent on the material used. It is advantageous to start from a material of good crystal quality, e.g. a monocrystalline material.

The lamellae fastened in this way onto the substrate may be subjected to lithographic treatments for the purpose of incorporating them in electronic devices.

BRIEF DESCRIPTION OF THE DRAWING

The invention can be better understood in the light of the following description given with reference to the figures of the accompanying drawing, in which.

DETAILED DESCRIPTION OF THE INVENTION

The method of the invention is explained in the context of obtaining graphene lamellae.

Figure 1:
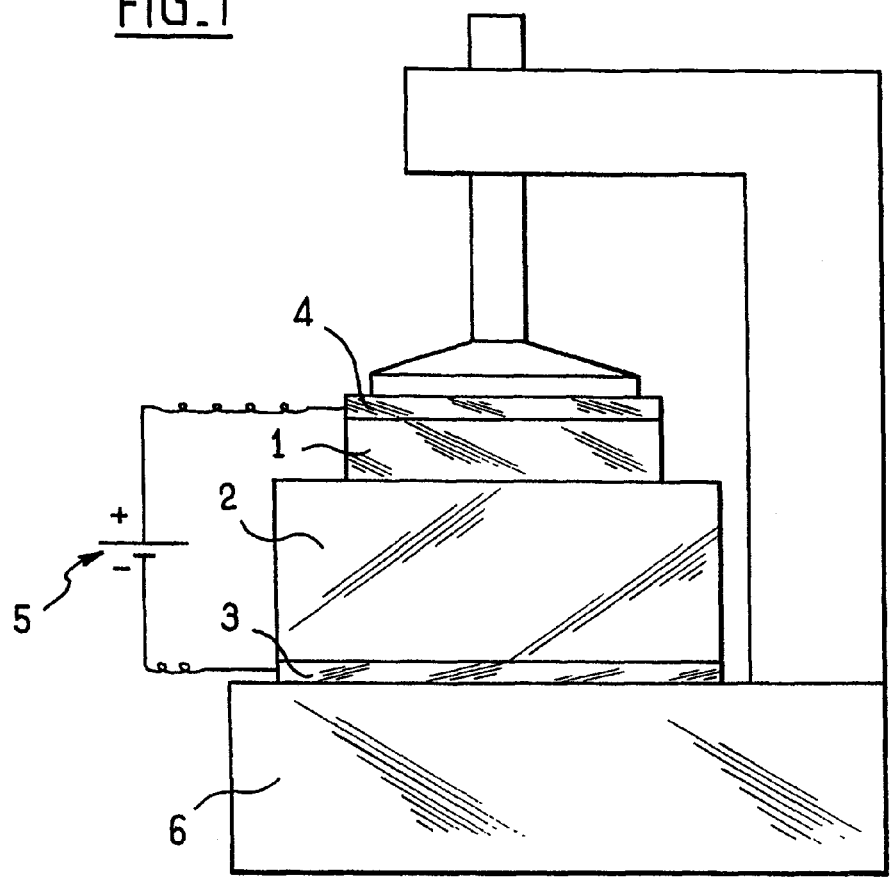
FIG. 1 is a diagrammatic view of a device enabling the method of the invention to be implemented.

As shown in FIG. 1, a sample of graphite 1 is placed on a glass substrate 2, here a borosilicate glass known under the trade name "Pyrex 7740". In this example, a substrate 2 is used having an area of about four square centimeters, and the sample 1 has an area of about one square centimeter.

In order to ensure good contact between the sample 1 and the substrate 2, the sample 1 is cleaved to expose to the substrate 2 a surface that is clean and free of impurities, while the surface of the substrate 2 is cleaned with solvents (trichlorethylene, acetone, and methanol).

A cathode 3 is placed against the glass substrate 2, while an anode 4 is placed against the graphite sample 1. The cathode 3 and the anode 4 are connected to an electricity source 5. The assembly is placed under a press 6 to press the graphite sample 1 against the glass substrate 2. Pressure of the order of $10^6$ pascals is applied in order to ensure uniform contact between the glass substrate 2 and the sample 1.

The substrate 2 is raised to a temperature of about 200 degrees Celsius (° C.), e.g. by putting the assembly into an enclosure and heating the enclosure. An electric field of about 1.7 kilovolts (kV) is applied to the assembly.

At this temperature, the alkali oxides $Na_2O$ of the glass substrate 2 dissociates into sodium cations $Na^+$ and oxygen anions $O^{2-}$. Under the effect of the electric field, the mobile sodium cations migrate towards the cathode 3 leaving the stationary oxygen anions in place, thereby creating a negative charge at the interface between the glass substrate 2 and the graphite sample 1.

On application of the electric field, a current becomes established very quickly, and it reaches its plateau value in a few seconds, which value is typically of the order of a few tens to a few hundreds of microamps (this value depends in particular on the contact area between the sample and the substrate). The graphite sample 1 begins to adhere to the glass substrate 2 as soon as current passes, and adhesion is considered to be complete when the current returns to a low value (a few percent of the plateau value), in this example over a period of the order of a few minutes to about 30 minutes.

The values given for temperature and electric field are given by way of indication. They depend on the material used and on the speed desired for fastening. In general, the inventors have observed that it is possible to compensate for a decrease in one of the parameters by increasing the other parameter, in order to obtain the same speed of fastening. Fastening is obtained most quickly for temperatures and electric fields that are high. Preferably, a temperature is used lying in the range [150° C., 350° C], and an electric field lying in the range [1.2 kV, 2 kV].

Figure 2:
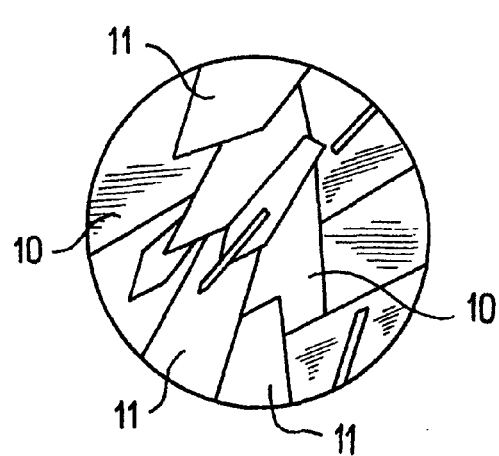
FIG. 2 is a greatly enlarged diagrammatic view of a glass substrate on which lamellae of graphene have been fastened.

It then suffices to cleave the sample so as to leave only a thin layer remaining on the glass substrate 2 as shown diagrammatically in FIG. 2, the layer being made up of lamellae of graphene. This thin layer has a thickness of not more than a few atoms.

By observation using a microscope or a Raman spectrograph, it is possible to identify in the thin layer some lamellae 10 that are fastened directly to the substrate, and other lamellae 11 that overlie the lamellae 10 and that give the thin layer a local thickness of a few atoms. The lamellae 11 that are not fastened directly to the substrate can be recovered or eliminated easily, e.g. by peeling off using an adhesive tape. This leaves on the glass substrate 2 only a few lamellae of graphene that are strongly fastened to the substrate, and that present thicknesses lying in the range a single layer of atoms to a few layers of atoms.

The graphene lamellae bonded in this way to the substrate naturally have no tendency to roll up and they are therefore easily manipulated. They may be subjected to various treatments directly on the substrate, including lithographic treatments.

Experiments carried out on highly oriented pyrolitic graphite (HOPG) and with natural graphite have made it possible to obtain graphene flakes fastened to the substrate to be that are of considerable size, up to 400 micrometers×200 micrometers, and commonly presenting an area of about 5000 square micrometers.

Preferably, by using samples of quasi monocrystalline natural graphite, it appears to be possible to obtain graphene flakes fastened on the substrate that present a size that is even greater.

The method of the invention should not be confused with the method whereby conductive materials are anodically bonded on borosilicate glass. It is known to perform anodic bonding of silicon on glass by heating and applying an electric field in a manner similar to that described above. However, anodic bonding relates to materials like silicon that present a three-dimensional crystal structure, presenting strong internal bonds, and suitable for easily forming oxide bonds Si-O-Si at the interface with the glass. All of those bonds are very strong and it is impossible to separate the material bonded to the glass. The thicknesses bonded in that way are thus microscopic, being of millimeter or greater order, which is no way comparable to the method of the invention.

On the contrary, the method of the invention applies to a lamellar material and seeks to bond only lamellae that are directly in contact with the substrate, i.e. over a thickness of a few atoms at most. It also remains possible to separate the lamellae that are not in direct contact with the substrate.

It should also be observed that the method of the invention is not mere electrostatic deposition, but is indeed a fastening method. The lamellae in contact with the substrate are firmly bonded to the substrate.

This method opens up new possibilities, and would appear to be suitable for use in a variety of applications, such as, for example, making field effect transistors (FETs) or metal oxide on silicon FETs (MOSFETs) that are based on graphene.

The invention is not limited to the above description, but on the contrary it covers any variant coming within the ambit defined by the claims.

In particular, although the method of the invention is described in an application seeking to obtain graphene lamellae, it is naturally possible to apply the invention to other types of conductive or semiconductive lamellar materials. Thus, the inventors have been able to use the method of the invention to fasten lamellae of the semiconductive material InSe and lamellae of the metallic and superconductive material $NbSe_2$.

Similarly, the substrate may be of glass, as described, or it may equally well be of any insulating material capable of presenting a certain amount of conductivity under certain conditions as a result of oxides decomposing that are suitable for separating into mobile ions having a given charge and stationary ions having an opposite charge. Such decomposition may be obtained by heating, as in the example described, or by any other means suitable for causing such decomposition. In particular, it is possible to use a substrate having a thin layer of borosilicate glass deposited on a mass of doped silicon, e.g. by radiofrequency magnetron sputtering. That type of substrate serves to reduce the magnetic field needed for fastening the lamellae on the substrate.

What is claimed is:

1. A method of fastening lamellae of a lamellar material that is at least partially conductive onto an insulating substrate (2) containing oxides that are suitable for dissociating into mobile ions of given charge and stationary ions of opposite charge, the method comprising the steps of:

placing a sample (1) of the lamellar material against a surface of the substrate;

causing the oxides of the substrate to dissociate; and subjecting the substrate and the sample to an electric field by means of an electrode in contact with the substrate and an electrode in contact with the sample.

2. A method according to claim 1, wherein the substrate is made of borosilicate glass containing alkali oxides Na2O suitable for dissociating into mobile Na+ cations and stationary O2- anions under the effect of temperature, and wherein the substrate is heated to cause said dissociation.

3. A method according to claim 2, wherein the substrate is heated to a temperature lying in the range between 150° Celsius and 350° Celsius.

4. A method according to claim 1, wherein the electric field lies in the range between 1.2 kilovolts and 2 kilovolts.

5. A method according to claim 1, wherein the lamellar material is graphite.

6. A method according to claim 1, comprising the step of, after subjecting the substrate and the sample to the electric field, cleaving the sample so as to leave only a thin layer of sample on the substrate.

7. A method of fastening lamellae of graphite onto an insulating substrate (2) containing oxides that are suitable for dissociating into mobile ions of given charge and stationary ions of opposite charge, the method comprising the steps of:

placing a sample (1) of graphite against a surface of the substrate;

causing the oxides of the substrate to dissociate; and subjecting the substrate and the sample to an electric field by means of an electrode in contact with the substrate and an electrode in contact with the sample.

8. A method of fastening lamellae of graphite, InSe or $NbSe_2$ onto an insulating substrate (2) containing oxides that are suitable for dissociating into mobile ions of given charge and stationary ions of opposite charge, the method comprising the steps of:

placing a sample (1) of graphite, InSe or $NbSe_2$ against a surface of the substrate;

causing the oxides of the substrate to dissociate; and subjecting the substrate and the sample to an electric field by means of an electrode in contact with the substrate and an electrode in contact with the sample.

* * * * *